(12) United States Patent
Li et al.

(10) Patent No.: US 11,817,848 B2
(45) Date of Patent: Nov. 14, 2023

(54) RESONATOR AND FILTER (71) Applicant: THE 13TH RESEARCH INSTITUTE OF CHINA ELECTRONICS TECHNOLOGY GROUP CORPORATION, Hebei (CN)

(72) Inventors: Liang Li, Shijiazhuang (CN); Xin Lv, Shijiazhuang (CN); Dongsheng Liang, Shijiazhuang (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 404 days.

(21) Appl. No.: 16/970,042

(22) PCT Filed: Dec. 27, 2018

(86) PCT No.: PCT/CN2018/124356
§ 371 (c)(1),
(2) Date: Aug. 14, 2020

(87) PCT Pub. No.: WO2020/124663
PCT Pub. Date: Jun. 25, 2020

(65) Prior Publication Data
US 2021/0367581 A1 Nov. 25, 2021

(30) Foreign Application Priority Data
Dec. 20, 2018 (CN) .......................... 201811592862.2

(51) Int. Cl.
*H03H 9/17* (2006.01)
*H03H 9/13* (2006.01)
(52) U.S. Cl.
CPC ................ *H03H 9/17* (2013.01); *H03H 9/13* (2013.01)

(58) Field of Classification Search
CPC ................................... H03H 9/17; H03H 9/13
See application file for complete search history.

(56) References Cited

U.S. PATENT DOCUMENTS

| 7,205,702 B2 | 4/2007 | Ha |
| 7,793,395 B2 | 9/2010 | Ha |

(Continued)

FOREIGN PATENT DOCUMENTS

| CN | 101465628 A | 6/2009 |
| CN | 103532516 A | 1/2014 |
| CN | 105743459 A | 7/2016 |

OTHER PUBLICATIONS

English Translation of CN 101465628 (Year: 2009).*
International Search Report in the international application No. PCT/CN2018/124356, dated Aug. 27, 2019, 2 pgs.

*Primary Examiner* — Bryan P Gordon
(74) *Attorney, Agent, or Firm* — Cooper Legal Group, LLC (57) ABSTRACT

The disclosure provides a resonator and a filter. The resonator includes: a substrate; and a multilayer structure formed on the substrate. The multilayer structure successively includes a lower electrode layer, a piezoelectric layer and an upper electrode layer from bottom to top. A cavity is formed between the substrate and the multilayer structure, and the cavity includes a lower half cavity below an upper surface of the substrate and an upper half cavity beyond the upper surface of the substrate and protruding toward the multilayer structure. A resonator with novel structure and good performance is formed by providing the cavity with the lower half cavity below the upper surface of the substrate and the upper half cavity above the upper surface of the substrate.

15 Claims, 6 Drawing Sheets (56) References Cited

U.S. PATENT DOCUMENTS

| | | |
|---|---|---|
| 9,653,516 B2 | 5/2017 | Tsai et al. |
| 9,998,087 B2 | 6/2018 | Tsai et al. |
| 2005/0077803 A1* | 4/2005 | Ha .................... H03H 3/02 |
| | | 310/324 |
| 2007/0157442 A1* | 7/2007 | Ha .................... H03H 3/02 |
| | | 29/25.35 |
| 2008/0024041 A1* | 1/2008 | Shibata .............. H03H 9/105 |
| | | 29/25.35 |
| 2016/0190206 A1 | 6/2016 | Tsai et al. |
| 2017/0134000 A1* | 5/2017 | Tsai .................. H03H 9/173 |

* cited by examiner

RESONATOR AND FILTER

CROSS-REFERENCE TO RELATED APPLICATIONS

The present application is a national stage of International Application No. PCT/CN2018/124356, filed on Dec. 27, 2018, which claims priority to Chinese Patent Application No. 201811592862.2, filed on Dec. 20, 2018. The disclosures of International Application No. PCT/CN2018/124356 and Chinese Patent Application No. 201811592862.2 are hereby incorporated by reference in their entireties.

TECHNICAL FIELD

The disclosure relates to the technical field of semiconductors, and particularly to a resonator and a filter.

BACKGROUND

A resonator may be used to realize signal processing functions in various electronic applications. For example, in some cellular phones and other communication devices, the resonator is used as a filter for signals transmitted and/or received. Depending on different applications, several different types of resonators may be used, for example, a Film Bulk Acoustic Resonator (FBAR), a coupled resonator filter (SBAR), a Stacked Bulk Acoustic Resonator (SBAR), a Dual Bulk Acoustic Resonator (DBAR) and a Solidly Mounted Resonator (SMR).

A typical acoustic resonator includes an upper electrode, a lower electrode, a piezoelectric material between the upper and lower electrodes, an acoustic reflection structure under the lower electrode and a substrate under the acoustic reflection structure. In general, an overlapping region of three material layers, i.e., the upper electrode, a piezoelectric layer and the lower electrode, in a thickness direction is defined as an effective region of the resonator. When a voltage signal at a certain frequency is applied between the electrodes, an acoustic wave that is vertically propagated may be generated between the upper and lower electrodes in the effective region, due to an inverse piezoelectric effect of the piezoelectric material. The acoustic wave is reflected to and fro between an interface of the upper electrode and the air and the acoustic reflection structure under the lower electrode and resonates at a certain frequency.

SUMMARY

Technical Problem

In view of this, embodiments of the disclosure provide a resonator and a filter, to provide a resonator and a filter with a novel structure.

Technical Solution

In a first aspect, the embodiment of the disclosure provides a resonator. The resonator includes:
a substrate;
a multilayer structure formed on the substrate, and the multilayer structure successively includes a lower electrode layer, a piezoelectric layer and an upper electrode layer from bottom to top;
a cavity is formed between the substrate and the multilayer structure, and the cavity includes a lower half cavity below an upper surface of the substrate and an upper half cavity beyond the upper surface of the substrate and protruding towards the multilayer structure.

Optionally, the lower half cavity is delimited by a bottom wall and a first sidewall. The whole bottom wall is parallel to a surface of the substrate, and the first sidewall is a first smooth curved surface extending from an edge of the bottom wall to the upper surface of the substrate.

Optionally, the first smooth curved surface includes a first curved surface and a second curved surface that are connected in a manner of smooth transition.

Optionally, the first curved surface has a vertical section with a shape of inverted parabola and is above a plane where the bottom wall is.

The second curved surface has a vertical section with a shape of parabola and is below a plane where the upper surface of the substrate is.

Optionally, a curvature of the first smooth curved surface at each point is less than a first preset value.

Optionally, the upper half cavity is delimited by a lower surface of the multilayer structure. A part, corresponding to the upper half cavity, of the multilayer structure includes a top wall and a second sidewall, and the second sidewall is a second smooth curved surface extending from an edge of the top wall to the upper surface of the substrate.

Optionally, the second smooth curved surface includes a third curved surface and fourth curved surface that are connected in a manner of smooth transition.

Optionally, the third curved surface has a vertical section with a shape of parabola and is below a plane where the top wall is.

The fourth curved surface has a vertical section with a shape of inverted parabola and is above the plane where the upper surface of the substrate is.

Optionally, a curvature of the second smooth curved surface at each point is less than a second preset value.

Optionally, the top wall does not include parts with sudden changes.

In a second aspect, the embodiment of the disclosure provides a filter, which includes any resonator in the first aspect of the embodiment of the disclosure.

Beneficial Effects

The following beneficial effects are achieved by the above technical solutions. According to the embodiments of the disclosure, a resonator with novel structure and good performance is formed by providing the cavity with the lower half cavity below the upper surface of the substrate and the upper half cavity above the upper surface of the substrate.

BRIEF DESCRIPTION OF THE DRAWINGS

In order to illustrate the technical solutions in the embodiments of the disclosure more clearly, the disclosure will be further elaborated with the drawings for illustrating the embodiments or the prior art. It is apparent that the drawings illustrated below only show some embodiments of the disclosure. Other drawings may further be obtained by those of ordinary skill in the art according to these drawings without creative work.

DETAILED DESCRIPTION

For making the technical problem to be solved, technical solutions and beneficial effects of the disclosure clearer, the disclosure will be further described below with reference to the drawings and the embodiments in detail. It is to be understood that specific embodiments described here are merely used to illustrate the disclosure, but are not intended to limit the disclosure.

The disclosure will further be described below with reference to the drawings and specific implementation modes in detail.

Figure 1:
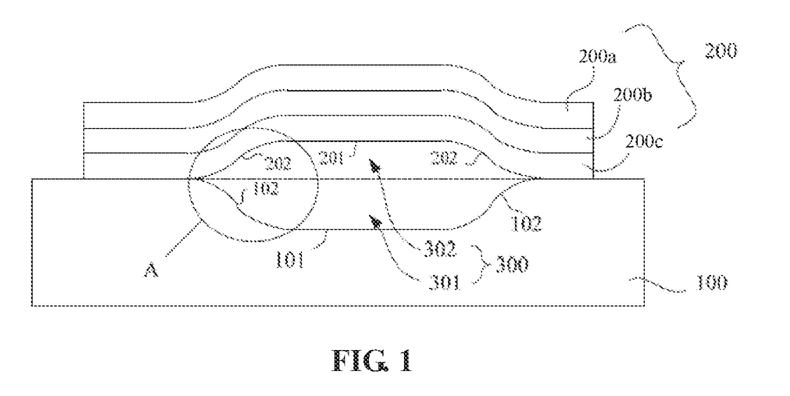
FIG. 1 is a schematic structural diagram of a resonator according to an embodiment of disclosure.

Referring to FIG. 1, a resonator of an embodiment of the disclosure is provided. The resonator includes a substrate 100 and a multilayer structure 200. The multilayer structure 200 is formed on the substrate 100, and the multilayer structure 200 successively includes a lower electrode layer 200c, a piezoelectric layer 200b and an upper electrode layer 200a from bottom to top. A cavity 300 is formed between the substrate 100 and the multilayer structure 200, and the cavity 300 includes a lower half cavity 310 below an upper surface of the substrate 100 and an upper half cavity 320 beyond the upper surface of the substrate 100 and protruding towards the multilayer structure 200.

Referring to FIG. 1, in an embodiment, the lower half cavity 310 is delimited by a bottom wall 101 and a first sidewall 102. The whole bottom wall 101 is parallel to the surface of the substrate 100, and the first sidewall 102 is a first smooth curved surface extending from an edge of the bottom wall 101 to the upper surface of the substrate 100.

Both the bottom wall 101 and the first sidewall 102 are surface walls of the substrate 100. Being the first smooth curved surface, the first sidewall 102 can ensure the performances of the resonator cavity without sudden changes.

Figure 2:
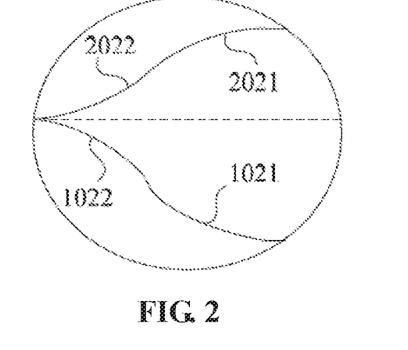
FIG. 2 is an enlarged schematic diagram of part A in FIG. 1.

Referring to FIG. 2, in an embodiment, the first smooth curved surface may include a first curved surface 1021 and second curved surface 1022 that are connected in a manner of smooth transition. The first curved surface 1021 and second curved surface 1022 that are connected in manner of smooth transition means that there is no sudden change at the junction between the first curved surface 1021 and the second curved surface 1022, and both the first curved surface 1021 and the second curved surface 1022 are a curved surfaces with no sudden-changes, so that the performances of the resonator cavity may be ensured. The substrate 100 is formed by a plurality of crystals (for example, silicon crystals), and no sudden change mean that gaps between crystals at the first smooth curved surface should not be too large and influence the performances of the resonator.

For example, the first curved surface 1021 may have a vertical section with a shape of inverted parabola and is above a plane where the bottom wall 101 is, and the second curved surface 1022 may have a vertical section with a shape of parabola and is below a plane where the upper surface of the substrate 100 is. The first curved surface 1021 is connected with the second curved surface 1022 in a manner of smooth connection. Certainly, the first curved surface 1021 and the second curved surface 1022 may also be curved surfaces in other shapes, as long as the gaps between crystals at the first smooth curved surface do not influence the performances of the resonator.

In an embodiment, when it is mentioned that the whole first smooth curved surface is smooth, it may mean that a curvature of the first smooth curved surface 1021 at each point is less than a first preset value. The first preset value may be determined according to practical condition such that the gaps between crystals at the first smooth curved surface do not influence the performances of the resonator. For ensuring a mechanical characteristics and electrical characteristics of the multilayer structure, the curvature of the smooth curved surface of a transition region is required to be as low as possible. Given a certain thickness of a sacrificial layer, the curvature as low as possible may cause a length of the transition region to increase, resulting in an increase of an area of a single resonator. Therefore, the curvature of the transition region and the length of the transition region need to be optimized. Preferably, a thickness of the cavity 300 may be 1 μm, the length of the transition region is controlled between 3 μm and 5 μm. The multilayer structure formed on the transition region can meet a requirement for the resonator. The length of the transition region is a length of the first sidewall 102 in a direction illustrated by the dotted line in FIG. 1.

Referring to FIG. 1, in an embodiment, the upper half cavity 302 may be delimited by a lower surface of the multilayer structure 200. The part, corresponding to the upper half cavity 302, of the lower surface of the multilayer structure 200 includes a top wall 201 and a second sidewall 202. The second sidewall 202 is a second smooth curved surface extending from an edge of the top wall 201 to the upper surface of the substrate 100.

Both the top wall 201 and the second sidewall 202 are lower walls of the multilayer structure 200. The second sidewall 202 is the second smooth curved surface, so that the performances of the resonator cavity can be ensured, and no sudden changes would occur.

Referring to FIG. 2, in an embodiment, the second smooth curved surface may include a third curved surface 2021 and fourth curved surface 2022 that are connected in a manner of smooth transition. The third curved surface 2021 and fourth curved surface 2022 that are connected in a manner of smooth transition means that there is no sudden change at the junction between the third curved surface 2021 and the fourth curved surface 2022, and both the third curved surface 2021 and the fourth curved surface 2022 are also curved surfaces with no sudden changes, so that the performances of the resonator cavity may be ensured. From the aspect of crystal, the substrate 100 is formed by a plurality of crystals (for example, silicon crystals), and no sudden change means that gaps between crystals at the second smooth curved surface should not be too large and influence the performances of the resonator.

For example, a vertical section of the third curved surface 2021 may have a shape of parabola and is below a plane where the top wall 201 is. A vertical section of the fourth curved surface 2022 may have a shape of inverted parabola and is above the plane where the upper surface of the substrate 100 is. Certainly, the third curved surface 2021 and the fourth curved surface 2022 may also be in other shapes, as long as the gaps between crystals at the first smooth curved surface do not influence the performances of the resonator.

In an embodiment, a curvature of the second smooth curved surface 2021 at each point is less than a second preset value. The second preset value may be determined according to the practical condition such that the gaps between crystals at the second smooth curved surface do not influence the performances of the resonator.

Furthermore, the top wall 201 does not include sudden change. The sudden change mentioned here has the same meaning as the above mentioned sudden change. From the aspect of crystal, the multilayer structure 200 is formed by a plurality of crystals, and no sudden change means that gaps between crystals at the top wall 201 should not be too large and influence the performances of the resonator.

In the above embodiments, the substrate 100 may be a silicon substrate or a substrate made from other materials. There are no limits in this regard.

Figure 3:
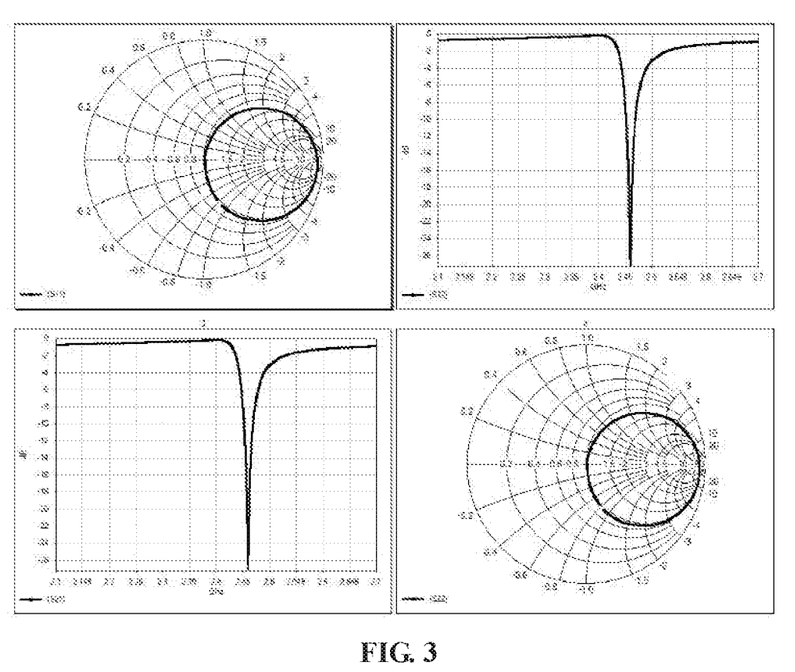
FIG. 3 is a performance test diagram of a resonator according to an embodiment of the disclosure.

Referring to FIG. 3, it shows data from the performance test of the resonator in the embodiment of the disclosure. For the resonator with such a structure, series resonance and parallel resonance frequencies are 2.393 GHz and 2.457 GHz respectively, Q-value in series resonance is 1,513, Q-value in a parallel resonance is 1,079, and an electromechanical coupling coefficient is 5.2%.

Regarding the resonator, a novel structure is obtained and good performance is achieved by providing with the cavity 300 having the lower half cavity 310 and the upper half cavity 320. The whole lower half cavity 310 is below the upper surface of the substrate 100 and the whole upper half cavity 320 is above the upper surface of the substrate 100.

Figure 4:
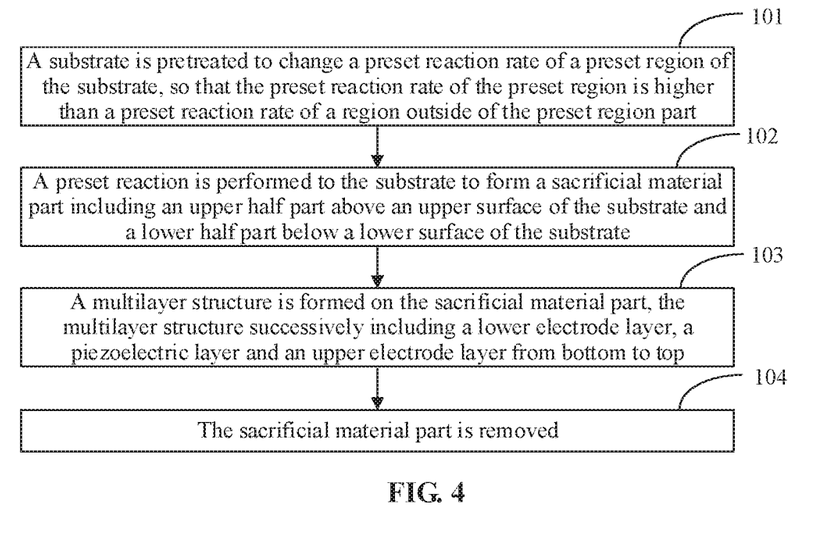
FIG. 4 is a flowchart of a method for manufacturing a resonator according to an embodiment of the disclosure.

Referring to FIG. 4, it shows a method for manufacturing a resonator according to an embodiment of the disclosure. The method includes the following steps.

At step 301, a substrate is pretreated to change a preset reaction rate of a preset region part of the substrate, so that the preset reaction rate of the preset region is higher than a preset reaction rate of a region outside the preset region.

In this step, the preset region of the substrate is pretreated to achieve the effect for the preset reaction rate of the preset region part of the substrate that the preset reaction rate of the preset region part is higher than the preset reaction rate of the region outside the preset region. Therefore, when a preset reaction is performed to the substrate in subsequent step 302, it can be ensured that the reaction rate of the preset region is different from that of the region outside the preset region, thereby forming a sacrificial material part having a preset shape.

At step 302, the preset reaction is performed to the substrate to form a sacrificial material part. The sacrificial material part includes an upper half part above the upper surface of the substrate and a lower half part below the lower surface of the substrate.

The lower half part is delimited by a bottom surface and a first side surface, the whole bottom surface is parallel to the surface of the substrate, and the first side surface is a first smooth curved surface extending from an edge of the bottom surface to the upper surface of the substrate. The upper half part is delimited by a lower surface of the multilayer structure. A part, corresponding to the upper half part, of the multilayer structure includes a top surface and a second side surface, and the second side surface is a second smooth curved surface extending from an edge of the top surface to the upper surface of the substrate.

Optionally, the first smooth curved surface includes a first curved surface and second curved surface that are connected in a manner of smooth transition. The first curved surface has a vertical section with a shape of inverted parabola and is above a plane where the bottom surface is, and the second curved surface has a vertical section with a shape of parabola and is below a plane where the upper surface of the substrate is.

Optionally, the second smooth curved surface includes a third curved surface and fourth curved surface that are connected in a manner of smooth transition. The third curved surface has a vertical section with a shape of parabola and is below a plane where the top surface is, and the fourth curved surface has a vertical section with a shape of inverted parabola and is above the plane where the upper surface of the substrate is.

In an embodiment, a curvature of the first smooth curved surface is less than a first preset value, and a curvature of the second smooth curved surface is less than a second preset value.

It should be understood that, since the preset reaction rate of the preset region part is higher than the preset reaction rate of the region outside the preset region, a sacrificial material part with a preset shape can be formed due to the faster reaction rate of the preset region part and the slower reaction rate of the region outside the preset region when performing the preset reaction to the substrate.

In an embodiment, step 302 is specifically done as follows. Oxidization treatment is performed on the substrate in an oxidization atmosphere to obtain the sacrificial material part. Correspondingly, the pretreatment performed on the substrate during step 301 is a manner to increase the oxidization reaction rate of the preset region of the substrate. The manner may be performing ion implantation to the preset region to increase the oxidization reaction rate of the preset region part of the substrate, and may also be forming a shielding layer with a preset pattern on the substrate to increase the oxidization treatment rate of the preset region part of the substrate.

Certainly, in another embodiment, the pretreatment of step 301 may also be performed by other manners, in addition to oxidization treatment. Similarly, the manner may be performing ion implantation to the preset region to increase the oxidization reaction rate of the preset region part of the substrate, and may also be forming the shielding layer with the preset pattern on the substrate to increase the oxidization treatment rate of the preset region part of the substrate.

At step 303, a multilayer structure is formed on the sacrificial material part. The multilayer structure successively includes a lower electrode layer, a piezoelectric layer and an upper electrode layer from bottom to top.

At step 304, the sacrificial material part is removed to form a resonator.

In the embodiment, the substrate may be, but not limited to silicon substrate or a substrate made from another material.

According to the method for manufacturing the resonator, a resonator with a special cavity structure is formed as follows: pretreating the substrate to make the reaction rate of the preset region of the substrate higher than the preset reaction rate of the region outside the preset region part, so as to form the sacrificial material part with the preset shape when performing the preset reaction to the substrate, then forming the multilayer structure on the sacrificial material part and finally removing the sacrificial material part. Compared with a conventional method for manufacturing a resonator, the method has the advantage that surface roughness of the working region of the resonator is easier to be controlled.

Figure 5:
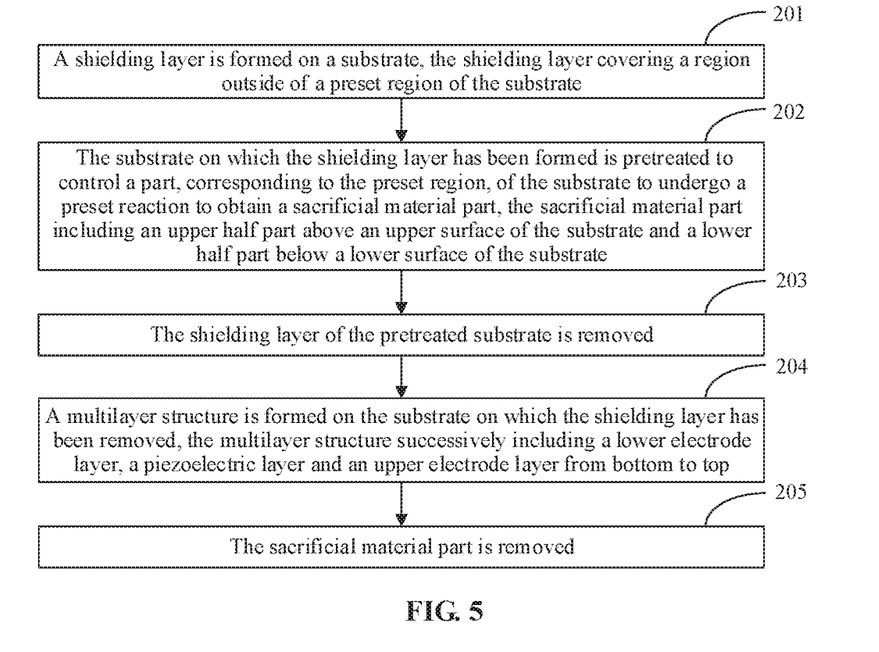
FIG. 5 is a flowchart of another method for manufacturing a resonator according to an embodiment of the disclosure.

Referring to FIG. 5, a method for manufacturing a resonator according to another embodiment of the disclosure is provided. This method includes the following steps.

Figure 6A:
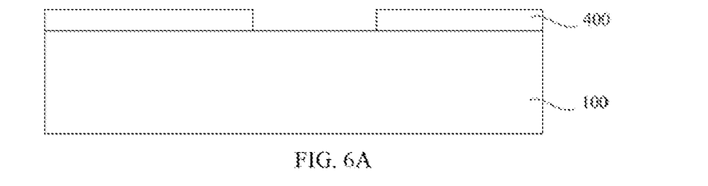
FIGS. 6A-6E are schematic diagrams of a process for manufacturing a resonator according to an embodiment of the disclosure.

At step 401, a shielding layer 400 is formed on a substrate. The shielding layer covers a region outside a preset region of the substrate, as shown in FIG. 6(a).

In this step, the formation of the shielding layer may include the following operations.

A shielding dielectric is provided on the substrate, and the shielding layer is used to shield the region outside the preset region of the substrate from a preset reaction.

The shielding dielectric on the preset region is removed to form the shielding layer.

The shielding dielectric is used to make the reaction rate of a region, covered with the shielding dielectric, of the substrate lower than a reaction rate of a part uncovered with the shielding dielectric. Furthermore, the shielding layer may be used to shield the region outside the preset region, of the substrate from the preset reaction.

At step 402, the substrate on which the shielding layer 400 has been formed is pretreated to control a part, corresponding to the preset region, of the substrate to undergo the preset reaction to obtain a sacrificial material part 500. The sacrificial material part 500 includes an upper half part above an upper surface of the substrate and a lower half part below a lower surface of the substrate.

The lower half part is delimited by a bottom surface and a first side surface. The whole bottom surface is parallel to the surface of the substrate, and the first side surface is a first smooth curved surface extending from an edge of the bottom surface to the upper surface of the substrate. The upper half part is delimited by a lower surface of the multilayer structure. A part, corresponding to the upper half part, of the multilayer structure includes a top surface and a second side surface, and the second side surface is a second smooth curved surface extending from an edge of the top surface to the upper surface of the substrate.

Optionally, the first smooth curved surface includes a first curved surface and second curved surface that are connected in a manner of smooth transition. For example, the first curved surface has a vertical section with a shape of inverted parabola and is above a plane where the bottom surface is, and the second curved surface has a vertical section with a shape of parabola and is below a plane where the upper surface of the substrate is.

Optionally, the second smooth curved surface includes a third curved surface and fourth curved surface that are connected in a manner of smooth transition. The third curved surface has a vertical section with a shape of parabola and is below a plane where the top surface is, and the fourth curved surface has a vertical section with a shape of inverted parabola and is above the plane where the upper surface of the substrate is.

In an embodiment, a curvature of the first smooth curved surface is less than a first preset value, and a curvature of the second smooth curved surface is less than a second preset value.

Figure 6B:
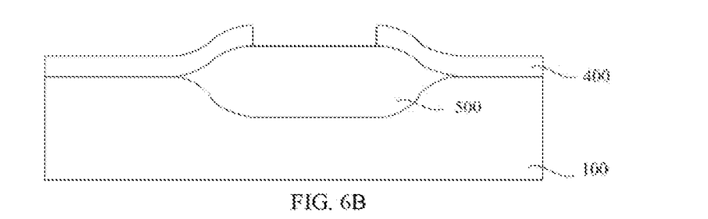

As an implementable mode, step 402 can be done as follows: oxidization treatment is performed on the substrate under an oxidization atmosphere, so that only the part, corresponding to the preset region, of the substrate undergoes an oxidization reaction to obtain the sacrificial material part 500, as shown in FIG. 6(b).

Optionally, the oxidization treatment of the substrate in the oxidization atmosphere may include the following operation.

High-purity oxygen is introduced toward the substrate in an environment at a process temperature of a preset temperature range to form an oxide layer on the part, corresponding to the preset region, of the substrate.

After a first preset time period, the introduction of high-purity oxygen toward the substrate is stopped. Through one or more manners selected from wet-oxygen oxidization, hydrogen-oxygen synthetic oxidization and high-pressure vapor oxidization, the oxide layer with a preset thickness is formed on the substrate.

Wet oxygen is stopped to be introduced toward the substrate, and the high-purity oxygen is introduced toward the substrate for a second preset time period to complete oxidization treatment to the substrate.

The preset range may be 1,000° C. to 1,200° C., the first preset time period may be 20 minutes to 140 minutes, the preset thickness may be 0.4 μm to 4 μm, the second preset time period may be 20 minutes to 140 minutes, and a flow of the high-purity oxygen may be 3 L/minute to 15 L/minute.

It should be noted that there might be certain differences in the morphology of the transition region when one or more manners selected from pure oxygen, wet oxygen, hydrogen-oxygen synthesis and high-pressure vapor oxidization are used. In addition, the type and structure of the shielding layer have a certain influence on the morphology of the transition region. The manner for oxidization as well as the type and structure of the shielding layer are reasonably selected according to the thickness of the multilayer structure and the requirement of the piezoelectric layer on a curvature change.

Figure 6C:
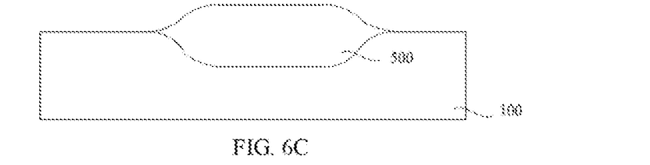

At step 403, the pretreated shielding layer of the substrate is removed, referring to FIG. 6C.

Figure 6D:
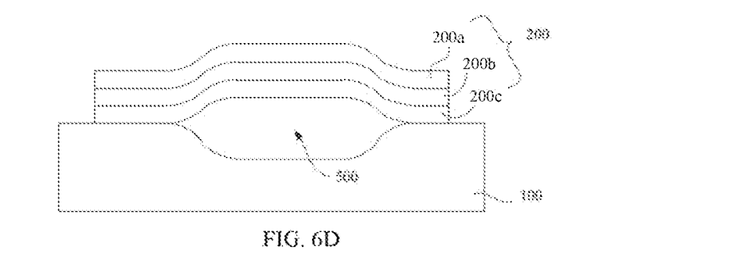

At step 404, a multilayer structure is formed on the substrate on which the shielding layer has been removed. The multilayer structure successively includes a lower electrode layer, a piezoelectric layer and an upper electrode layer from bottom to top, as shown in FIG. 6D.

Figure 6E:
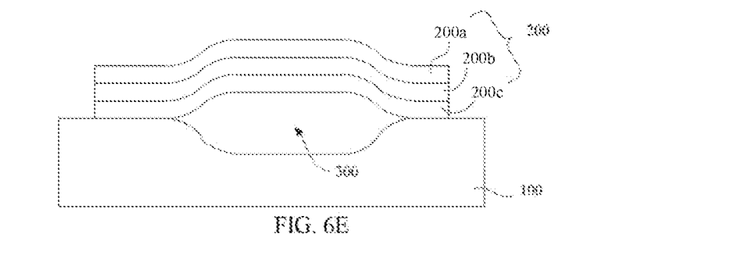

At step 405, the sacrificial material part is removed, as shown in FIG. 6E.

In the embodiment, the shielding layer may be made from SiN, $SiO_2$, polysilicon, or have a multilayer structure composed of a combination of layers made from two or three materials mentioned above. The substrate may be, but is not limited to a silicon substrate or a substrate made from other materials.

In an embodiment, the shielding layer may be made from SiN, and may also have a multilayer structure. When SiN is used to form the oxide shielding layer, a relatively good shielding effect would be achieved, resulting in a significant difference of reaction rates between a shielding region and a non-shielding region. The shielding dielectric on a region where a resonator is required to be manufactured may be removed by means of etching or corrosion, etc. When a silicon wafer is oxidized in the oxidization atmosphere, the reaction rate of the region covered with the shielding dielectric is greatly different from the reaction rate of the region not covered with the shielding dielectric. The reaction rate of the region not covered with the shielding dielectric is higher. Si of the substrate reacts with oxygen to generate $SiO_2$, and the generated $SiO_2$ continuously increases in the thickness. Therefore, an upper surface of the region on which the reaction occurs, of the substrate gradually gets higher than the surface of the region covered with the shielding dielectric. The Si surface of the region not covered with the shielding dielectric gradually gets lower, and relative to the surface, which gets lower, of the part not including the shielding dielectric. Since oxygen will enter from the side at the edge of the shielding layer and will enter below the shielding layer, an oxidization rate at the edge of the shielding layer is lower than an oxidization rate of the region not covered with the shielding dielectric and higher than an oxidization rate of the region covered with shielding dielectric. The closer to the edge of the shielding dielectric, the closer the rate to the oxidization rate of the region not covered with the shielding dielectric. A transition region where no changes occur in the rate may be formed at the edge of the shielding layer. At the transition region, a smooth curved surface may be formed by optimizing an oxidization manner and a type and structure of the shielding layer, such that a crystal quality of the piezoelectric film may be ensured when growing a multilayer structure comprising a piezoelectric film, such as AlN, on this smooth curved surface.

An embodiment of the disclosure also relates to a semiconductor device including a resonator mentioned above and has the beneficial effects produced by the resonator. For example, the semiconductor device may be a filter.

The above description is merely used to illustrate the preferred embodiments of the disclosure and is not intended to limit the disclosure. Any modifications, equivalent replacements, improvements and the like made within the spirit and principle of the disclosure shall fall within the scope of protection of the disclosure.

The invention claimed is:

1. A resonator, comprising:
a substrate; and
a multilayer structure formed on the substrate, wherein the multilayer structure successively consists of a lower electrode layer, a piezoelectric layer and an upper electrode layer from bottom to top,
wherein a cavity is formed between the substrate and the multilayer structure, and the cavity comprises a lower half cavity below an upper surface of the substrate and an upper half cavity beyond the upper surface of the substrate and protruding toward the multilayer structure,
wherein the upper half cavity is delimited by a lower surface of the multilayer structure,
a part, corresponding to the upper half cavity, of the multilayer structure comprises a top wall and a second sidewall which both are lower walls of the multilayer structure, and the second sidewall is a second smooth curved surface extending from an edge of the top wall to the upper surface of the substrate,
wherein the second smooth curved surface comprises a third curved surface and fourth curved surface that are connected in a manner of smooth transition,
wherein the third curved surface has a vertical section with a shape of a parabola and is below a plane where the top wall is located, and
the fourth curved surface has a vertical section with a shape of an inverted parabola and is above a plane where the upper surface of the substrate is located.

2. The resonator of claim 1, wherein the lower half cavity is delimited by a bottom wall and a first sidewall, the whole bottom wall is parallel to a surface of the substrate, and the first sidewall is a first smooth curved surface extending from an edge of the bottom wall to the upper surface of the substrate.

3. The resonator of claim 2, wherein the first smooth curved surface comprises a first curved surface and second curved surface that are connected in a manner of smooth transition.

4. The resonator of claim 3, wherein the first curved surface has a vertical section with a shape of an inverted parabola and is above a plane where the bottom wall is located; and
the second curved surface has a vertical section with a shape of a parabola and is below the plane where the upper surface of the substrate is located.

5. The resonator of claim 2, wherein a curvature of the first smooth curved surface at each point is less than a first preset value.

6. The resonator of claim 1, wherein a curvature of the second smooth curved surface is less than a second preset value.

7. The resonator of claim 1, wherein the top wall does not include parts with sudden changes.

8. A semiconductor device, comprising a resonator, wherein the resonator comprises:
a substrate; and
a multilayer structure formed on the substrate, wherein the multilayer structure successively consists of a lower electrode layer, a piezoelectric layer and an upper electrode layer from bottom to top,
wherein a cavity is formed between the substrate and the multilayer structure, and the cavity comprises a lower half cavity below an upper surface of the substrate and an upper half cavity beyond the upper surface of the substrate and protruding toward the multilayer structure,
wherein the upper half cavity is delimited by a lower surface of the multilayer structure,
a part, corresponding to the upper half cavity, of the multilayer structure comprises a top wall and a second sidewall which both are lower walls of the multilayer structure, and the second sidewall is a second smooth curved surface extending from an edge of the top wall to the upper surface of the substrate,
wherein the second smooth curved surface comprises a third curved surface and fourth curved surface that are connected in a manner of smooth transition,
wherein the third curved surface has a vertical section with a shape of a parabola and is below a plane where the top wall is located, and
the fourth curved surface has a vertical section with a shape of an inverted parabola and is above a plane where the upper surface of the substrate is located.

9. The resonator of claim 6, wherein the top wall does not include parts with sudden changes.

10. The semiconductor device of claim 8, wherein the lower half cavity is delimited by a bottom wall and a first sidewall, the whole bottom wall is parallel to a surface of the substrate, and the first sidewall is a first smooth curved surface extending from an edge of the bottom wall to the upper surface of the substrate.

11. The semiconductor device of claim 10, wherein the first smooth curved surface comprises a first curved surface and second curved surface that are connected in a manner of smooth transition.

12. The semiconductor device of claim 11, wherein the first curved surface has a vertical section with a shape of an inverted parabola and is above a plane where the bottom wall is located; and
the second curved surface has a vertical section with a shape of a parabola and is below the plane where the upper surface of the substrate is located.

13. The semiconductor device of claim 10 wherein a curvature of the first smooth curved surface at each point is less than a first preset value.

14. The semiconductor device of claim 8, wherein a curvature of the second smooth curved surface is less than a second preset value.

15. The semiconductor device of claim 8, wherein the top wall does not include parts with sudden changes.

\* \* \* \* \*